United States Patent
Sung et al.

(10) Patent No.: US 6,538,277 B2
(45) Date of Patent: Mar. 25, 2003

(54) SPLIT-GATE FLASH CELL

(75) Inventors: Hung-Cheng Sung, Hsin-chu (TW); Di-Son Kuo, Hsinchu (TW); Chuang-Ke Yeh, Hsin Chu (TW); Chia-Ta Hsieh, Tainan (TW); Yai-Fen Lin, Taichung (TW); Wen-Ting Chu, Kaoshing County (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/920,601

(22) Filed: Aug. 2, 2001

(65) Prior Publication Data

US 2002/0027241 A1 Mar. 7, 2002

Related U.S. Application Data (62) Division of application No. 09/208,913, filed on Dec. 10, 1998, now Pat. No. 6,309,928.

(51) Int. Cl.⁷ ............................................. H01L 29/788
(52) U.S. Cl. .................... 257/317; 257/315; 257/321; 257/324; 365/185.01; 365/185.28
(58) Field of Search ..................... 257/314, 315, 257/317, 321, 324; 438/257; 365/185.01, 185.26, 185.28

(56) References Cited

U.S. PATENT DOCUMENTS

| | | | | |
|---|---|---|---|---|
| 4,267,632 A | * | 5/1981 | Shappir | 438/257 |
| 5,104,819 A | * | 4/1992 | Freiberger et al. | 438/593 |
| 5,162,247 A | | 11/1992 | Hazani | 438/259 |
| 5,173,436 A | | 12/1992 | Gill et al. | 438/262 |
| 5,231,299 A | * | 7/1993 | Ning et al. | 257/316 |
| 5,262,655 A | | 11/1993 | Ashida | 257/66 |
| 5,495,441 A | | 2/1996 | Hong | 365/185.01 |
| 5,502,321 A | * | 3/1996 | Matsushita | 257/316 |
| 5,554,564 A | * | 9/1996 | Nishioka et al. | 438/396 |
| 5,572,054 A | * | 11/1996 | Wang et al. | 257/322 |
| 5,592,002 A | * | 1/1997 | Kanamori | 257/321 |
| 5,597,751 A | | 1/1997 | Wang | 438/261 |
| 5,716,865 A | | 2/1998 | Ahn | 438/264 |
| 5,783,473 A | * | 7/1998 | Sung | 438/265 |
| 5,872,036 A | * | 2/1999 | Sheu | 438/266 |
| 5,880,008 A | * | 3/1999 | Akiyama et al. | 438/444 |
| 5,891,788 A | * | 4/1999 | Fazan et al. | 438/439 |
| 5,915,178 A | * | 6/1999 | Chiang et al. | 438/266 |
| 5,994,184 A | * | 11/1999 | Fukumoto | 438/257 |
| 5,994,192 A | * | 11/1999 | Chen | 438/303 |
| 6,031,264 A | * | 2/2000 | Chien et al. | 257/315 |
| 6,117,733 A | * | 9/2000 | Sung et al. | 438/265 |
| 6,259,131 B1 | * | 7/2001 | Sung et al. | 257/315 |

FOREIGN PATENT DOCUMENTS

JP   4-07-135265   *   5/1995   ......... H01L/29/788

OTHER PUBLICATIONS

S. Wolf, "Silicon Processing for the VLSI Era," vol. 2, Lattice Press, Sunset Beach CA, 1990, pp. 438 and pp. 632–634.

* cited by examiner

Primary Examiner—George Eckert
(74) Attorney, Agent, or Firm—George O. Saile; Stephen B. Ackerman; Sevgin Oktay (57) ABSTRACT

A novel method of forming a first polysilicon gate tip (poly-tip) for enhanced F-N tunneling in split-gate flash memory cells is disclosed. The poly-tip is formed in the absence of using a thick polysilicon layer as the floating gate. This is made possible by forming an oxide layer over the poly-gate and oxidizing the sidewalls of the polygate. Because the starting thickness of polysilicon of the floating gate is relatively thin, the resulting gate beak, or poly-tip, is also necessarily thin and sharp. This method, therefore, circumvents the problem of oxide thinning encountered in scaling down devices of the ultra large scale integration technology and the fast programmability and erasure performance of EEPROMs is improved.

5 Claims, 8 Drawing Sheets

SPLIT-GATE FLASH CELL

This is a division of patent application Ser. No. 09/208,913, filing date Dec. 10, 1998, U.S. Pat. No. 6,309,928, Novel Split-Gate Flash Cell, assigned to the same assignee as the present invention.

BACKGROUND OF THE INVENTION (1) Field of the Invention

The present invention relates to split-gate memory cells used in flash EEPROMs (Electrically Erasable Programmable Read Only Memories), and in particular, to a method of forming a novel split-gate flash cell having a self-aligned source with a novel poly-tip.

(2) Description of the Related Art

The performance of EEPROMs is enhanced by providing a protrusion for the floating gate of the split-gate cell. Normally, the protrusion is formed by poly oxidation, that is, by oxidizing the polysilicon of which the floating gate comprises. That is, the oxidized portion of the poly-gate is used as a hard mask to form a protruding, so-called gate bird's beak, or, a tip, which in turn enhances Fowler-Nordheim (F-N) tunneling for the programming and erasing of an EEPROM cell. However, thick poly is needed in order to grow a thick poly-oxide hard-mask. Thick poly, on the other hand, increases gate coupling ratio (GCR), a parameter which is well-known in the art. Thicker GCR then degrades the programming and erasing function of the cell. Especially, with the fast pace of miniaturization and scaling down of devices, it is becoming more and more difficult to form thick poly-oxides because of the oxide thinning effect. Also, self-alignment to source and isolation regions are becoming difficult. It is disclosed in this invention a method of poly-gate side-wall oxidation which circumvents some of these difficulties.

In general, programming and erasing of an EEPROM cell is accomplished electrically by using Fowler-Nordheim (F-N) tunneling as is well known in prior art. F-N tunneling, in turn, is enhanced usually by providing, what is known as a gate bird's beak (GBB) at the corner of a gate structure of the memory cell. However, the forming of a GBB must be optimized carefully, for, otherwise, the GBB can encroach under the gate edge and degrade the programmability of submicron memory cells. That is, the dimensions and shape of the GBB, which is described below more in detail in relation to nonvolatile memories, play an important role in transferring current to and fro between the substrate and the floating gate, and hence the charging speed of the memory cell, and the amount of surface current leakage that takes place around and near the bird's beak. It is disclosed later in the embodiments of the present invention a novel approach to form a polysilicon gate tip (poly-tip) in place of gate bird's beak for enhanced F-N tunneling.

Among the nonvolatile read only memories, such as masked-ROMs, Electrically Programmable (EP-ROMs), EEPROMs have been known as one type of nonvolatile memory semiconductor devices capable of electrically writing and erasing information. However, EEPROMs require two transistors to operate. In Flash EEPROM, the memory cell includes one transistor, and the contents of all the memory's cells can be erased simultaneously through the use of an electrical erase signal. Hence, with Flash memory, in addition to gaining speed in having the cells erased much more rapidly, higher levels of integration can be achieved with fewer devices.

The unit cell of an EEPROM memory device is usually comprised of a silicon substrate provided with a source and a drain, and two polysilicon gates; that is, a MOS transistor having a channel defined by the source and drain regions, a floating gate to which there is no direct electrical connection and a control gate with a direct electrical connection. The floating gate is separated from the substrate by an insulating layer of, for example, silicon oxide. The control gate is generally positioned over the floating gate with a layer of insulating material separating the two gates. To program a transistor, electron is injected from the substrate through the insulator and is stored on the floating gate of the transistor. The amount of charge is set to one of two levels to indicate whether the cell has been programmed "on" or "off." "Reading" of the cell's state is accomplished by applying appropriate voltages to the cell source and drain, and to the control gate, and then sensing the amount of charge on the floating gate. To erase the contents of a cell, the programming process is reversed, namely, electrons are removed from the floating gate by transferring them to the control gate through the insulator. A fairly recent technology is "flash" memories in which the entire array of memory cells, or a significant subset thereof, is erased simultaneously. Flash EEPROMs combine the advantages of UV-erasable EPROMS and floating-gate EEPROMs. They offer high density, small cell size, the well-known hot-electron writeability of EPROMs, together with the easy reusability, on-board reprogrammability, and electron-tunneling erasure feature of EEPROMs (See S. Wolf, "Silicon Processing for the VLSI Era," vol. 2, Lattice Press, Sunset Beach, Calif., 1990, pp. 632–634.)

As stated earlier, programming and erasing of an EEPROM is accomplished electrically and in-circuit by using Fowler-Nordheim tunneling. Basically, a sufficiently high voltage is applied to the control gate and drain while the source is grounded to create a flow of electrons in the channel region in the substrate. Some of these electrons gain enough energy to transfer from the substrate to the floating gate through the thin oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling.

Figure 1:
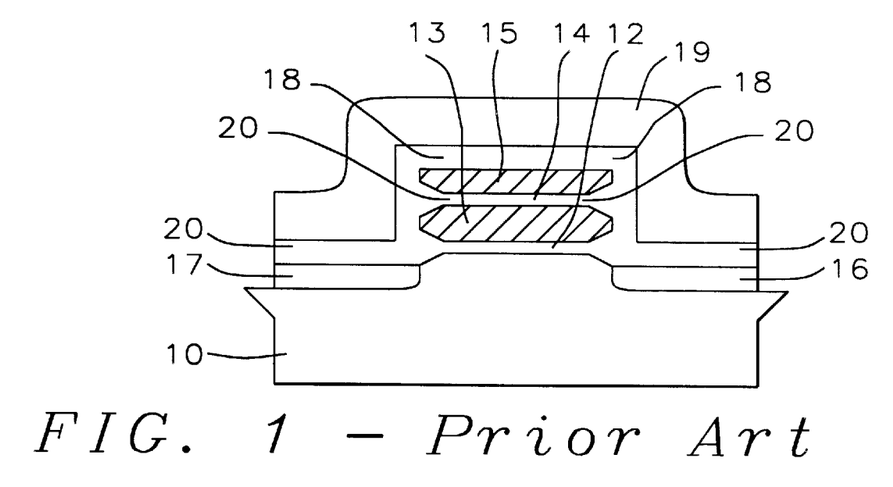
FIG. 1 shows a partial cross-sectional view of a Flash EEPROM of prior art.

A cross section of a conventional Flash EEPROM is shown in FIG. 1. Drain impurity diffusion layer (16) and a source impurity diffusion layer (17) are formed on a main surface of the semiconductor substrate (10) and are spaced from each other by a predetermined distance with a channel region therebetween. The conventional Flash EEPROM further includes a floating gate electrode (13) formed on the channel region with a first gate oxide film (12) therebetween, a control gate electrode (15) formed on the floating gate electrode (13) with an insulating film (14) therebetween, an interlayer thermal oxide film (18) covering the semiconductor substrate (10), floating gate electrode (13) and control gate electrode (15), and an interlayer insulating film (19)

covering the interlayer thermal oxide film (18). Gate bird's beak oxide films (20) are formed at opposite ends of the first gate oxide film (12) and opposite end of the insulating film (14). The interlayer insulating film (19) contains impurity such as boron or phosphorous. The purpose of the interlayer thermal oxide film (18) is to prevent the movement of impurity such as boron of phosphorous of the interlayer insulating film (19) into the semiconductor substrate (10), control gate electrode (15) or floating gate electrode (13) and thus to prevent change of the electrical characteristics thereof.

After the final step of forming the interlayer insulating film (19) to cover the interlayer thermal oxide film (18) shown in FIG. 1, usually heat treatment by a reflow method is carried out to flatten the interlayer insulating film (19). During this process as well as during thermally growing the thermal oxide layer (18) by means of wet oxidation, oxidizer ($H_2O$) penetrates the interlayer insulating film (19) and interlayer thermal oxide film (18). This causes further oxidization between the semiconductor substrate (10) and the ends of the floating gate electrode (13), and between the control gate electrode (15) and the floating gate electrode (13). As a result, the gate bird's beak oxide films (20) are formed. Consequently, the lower end of the floating gate electrode (13) contacts the gate bird's beak oxide films (20) so that the lower end of the floating gate electrode (13) is oxidized to a large extent as compared with the other portions.

The gate bird's beak oxide film (20) can form either at the lower end of the floating gate (13) and the source impurity diffusion layer (17), or at the lower end of the floating gate near the drain impurity diffusion layer (16), or at both locations. In these cases, the conventional "beak" of the bird's beak is usually long and elongated, thus increasing the size of the cell and at the same time providing paths for current leakage and, therefore, low memory speed.

Figure 2A:
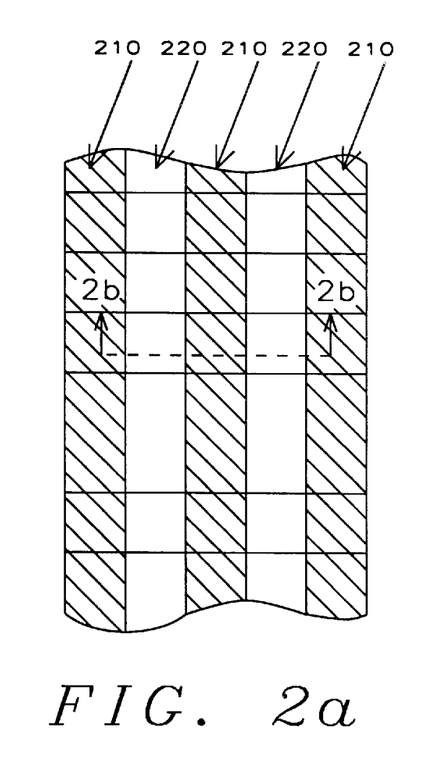
FIG. 2a is a partial top view of a semiconductor substrate showing regions where shallow trench isolation regions and gate regions are to be formed according to this invention.
Figure 2B:
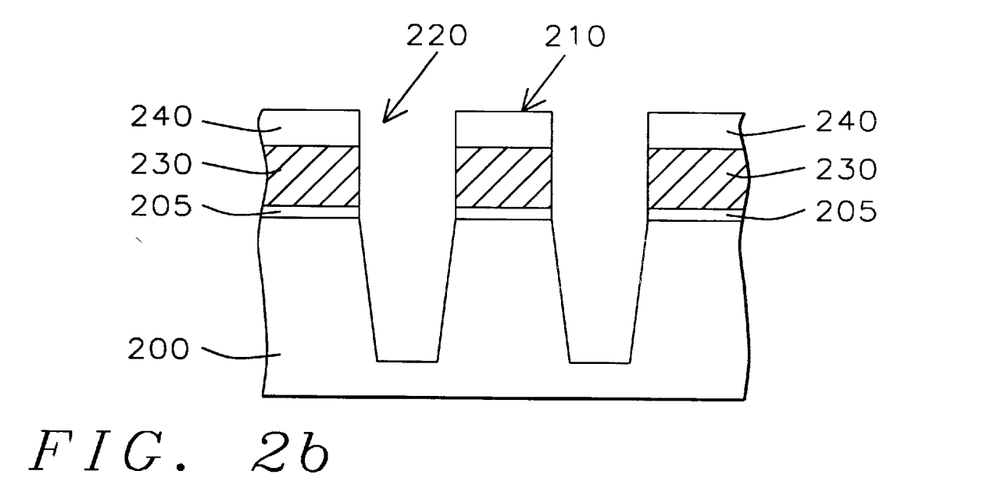
FIG. 2b shows a horizontal cross-sectional view of the substrate of FIG. 2a after the forming of a first polysilicon layer and shallow trench, according to this invention.
Figure 2C:
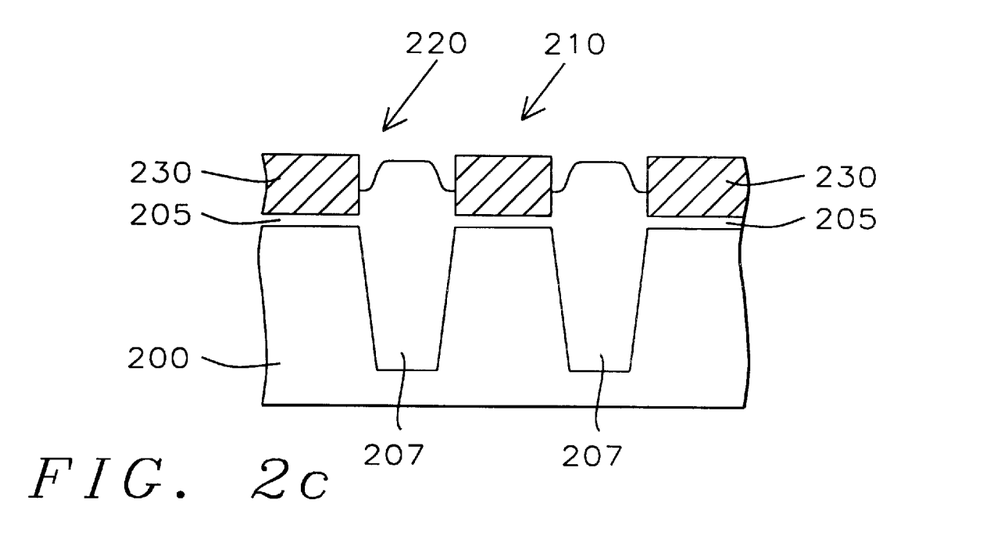
FIG. 2c shows a horizontal cross-sectional view of the substrate of FIG. 2a after the filling of the trench of FIG. 2b with oxide, according to this invention.
Figure 2D:
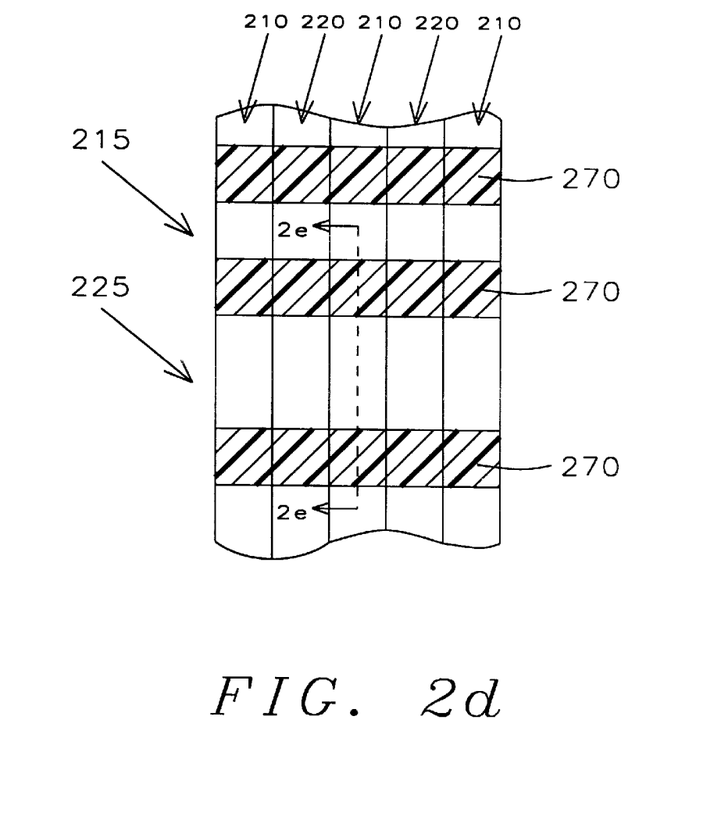
FIG. 2d shows a top view of the substrate of FIG. 2a after the forming of a poly-1 photomask over layers formed covering the first polysilicon layer of FIG. 2a, according to this invention.
Figure 2E:
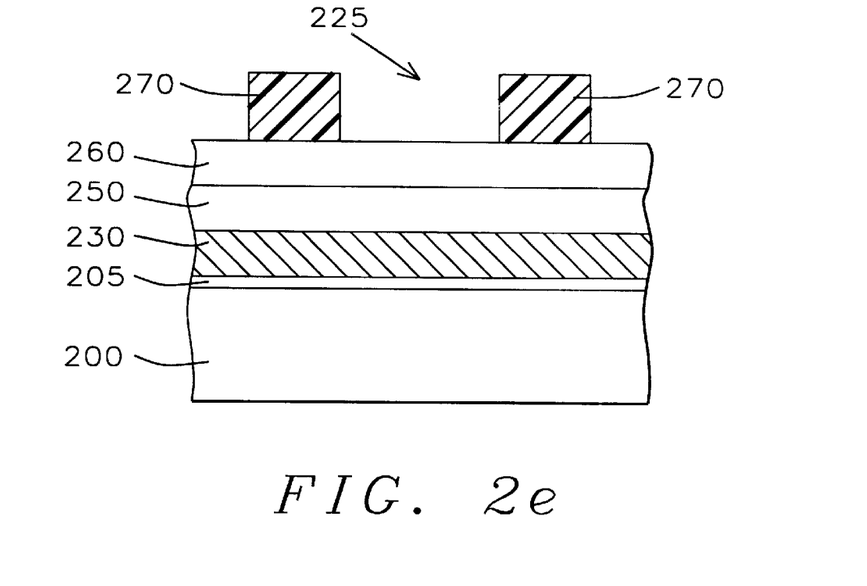
FIG. 2e is a vertical cross-sectional view of the substrate of FIG. 2d showing the various layers formed over the first polysilicon layer, according to this invention.
Figure 2F:
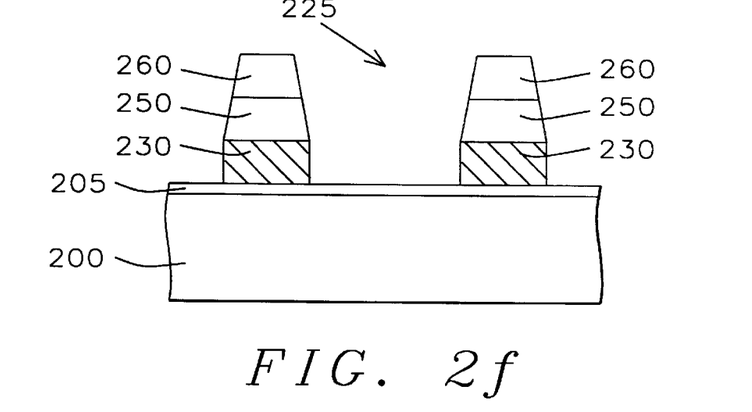
FIG. 2f is a cross-sectional view of the substrate of FIG. 2e showing the forming of a sloping floating gate structure of this invention.
Figure 2G:
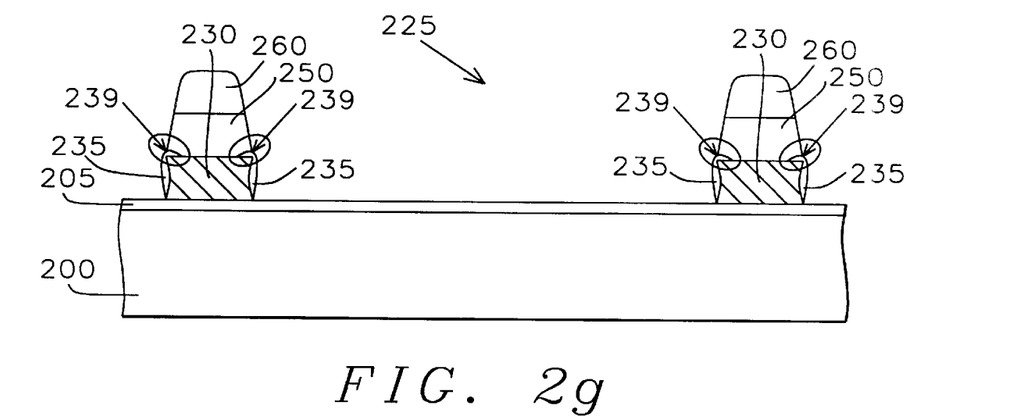
FIG. 2g is a cross-sectional view of the substrate of FIG. 2f showing the side-wall oxidation of the floating gate to form the poly-tip of this invention.
Figure 2H:
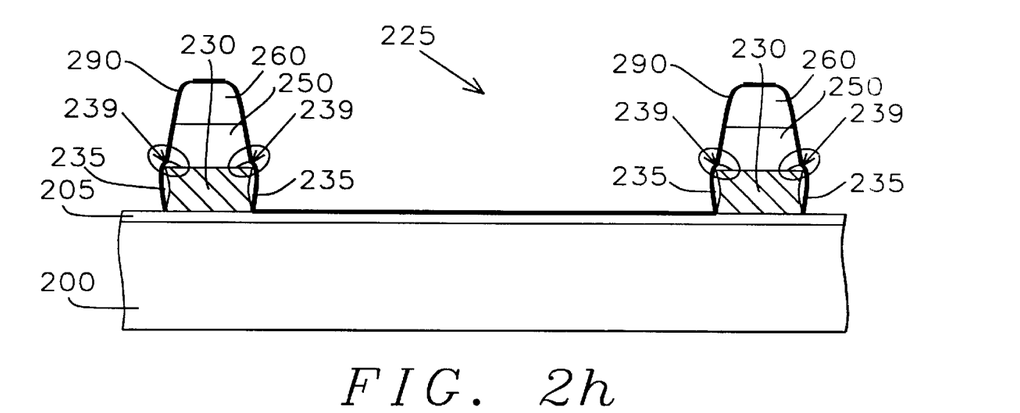
FIG. 2h is a cross-sectional view of the substrate of FIG. 2g showing the forming of the hot temperature oxide (HTO) according to this invention.
Figure 2I:
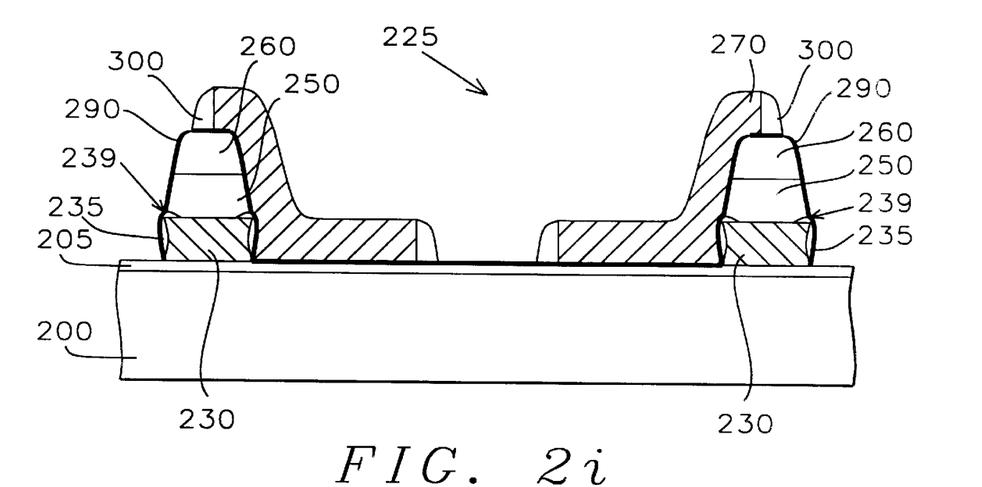
FIG. 2i is a cross-sectional view of the substrate of FIG. 2h showing the forming of the control gate and oxide spacers of this invention.
Figure 2J:
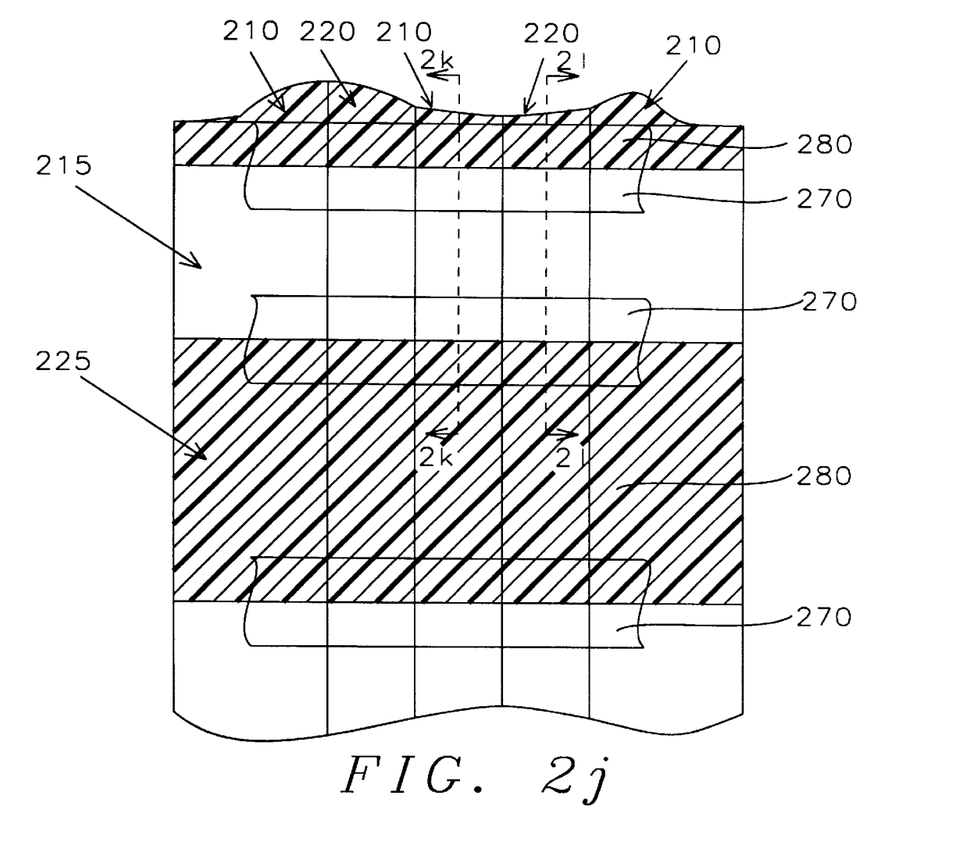
FIG. 2j shows a top view of the substrate of FIG. 2a after the forming of a self-aligned source SAS-mask over the poly-1 mask of FIG. 2d, according to this invention.
Figure 2K:
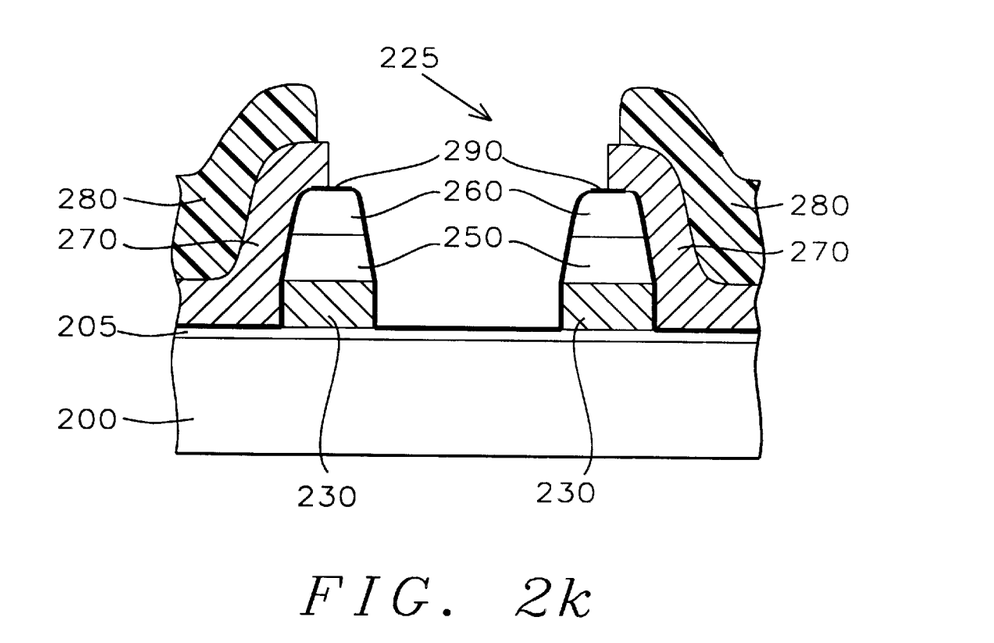
FIG. 2k shows a vertical cross-sectional view of the substrate of FIG. 2j taken along the region having first polysilicon layer, and after the forming of the SAS-mask according to this invention.
Figure 2L:
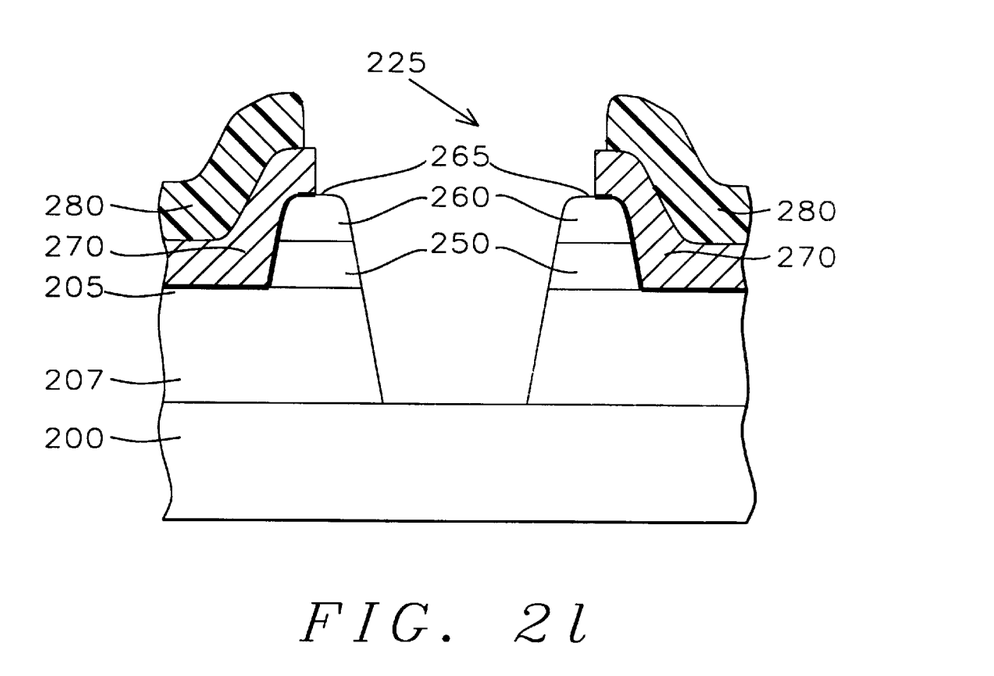
FIG. 2l shows a vertical cross-sectional view of the substrate of FIG. 2j taken along the trench region after the removal of oxide from the shallow trench of FIG. 2c, according to this invention.
Figure 2M:
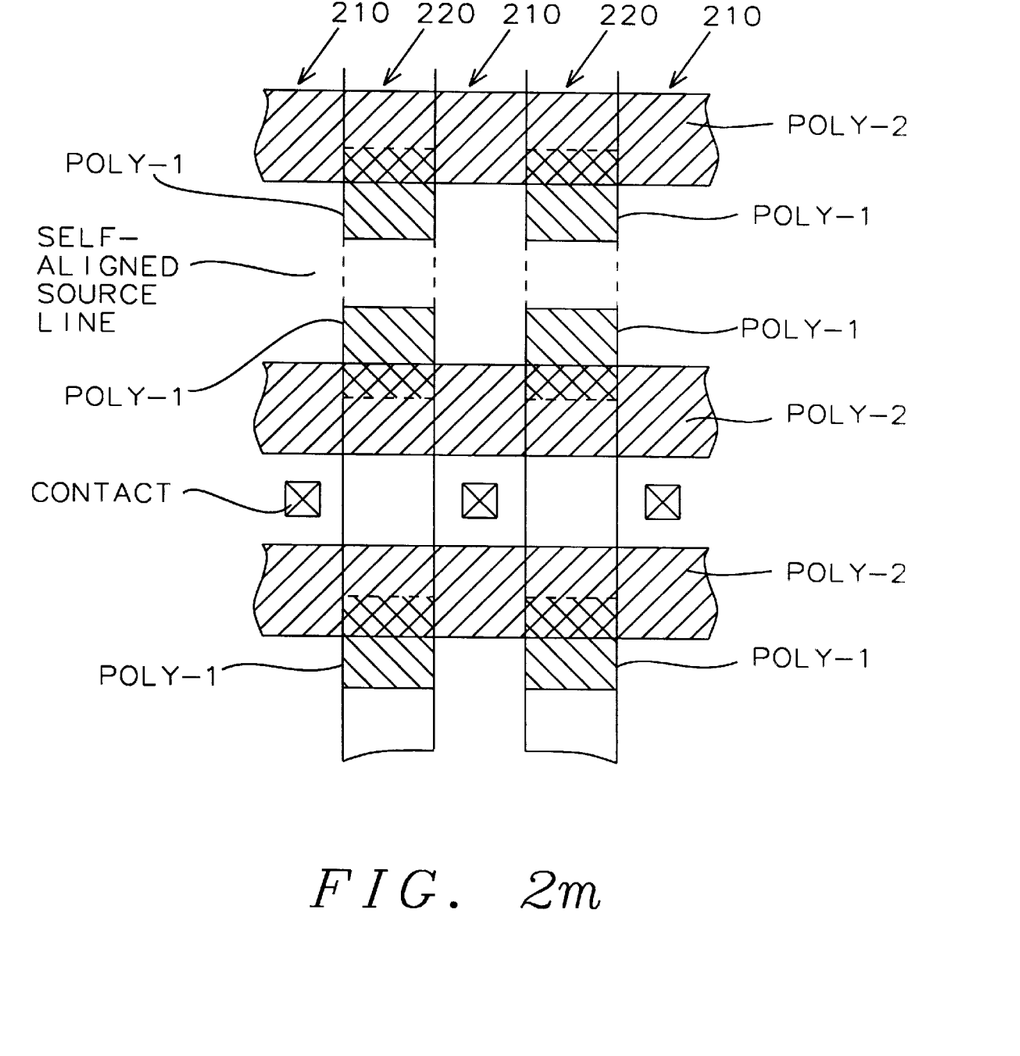
FIG. 2m is another top view of the substrate of FIG. 2a showing the spatial relationships between the control gate, floating gate having a poly-tip, and the self-aligned source line of this invention.
Figure 2N:
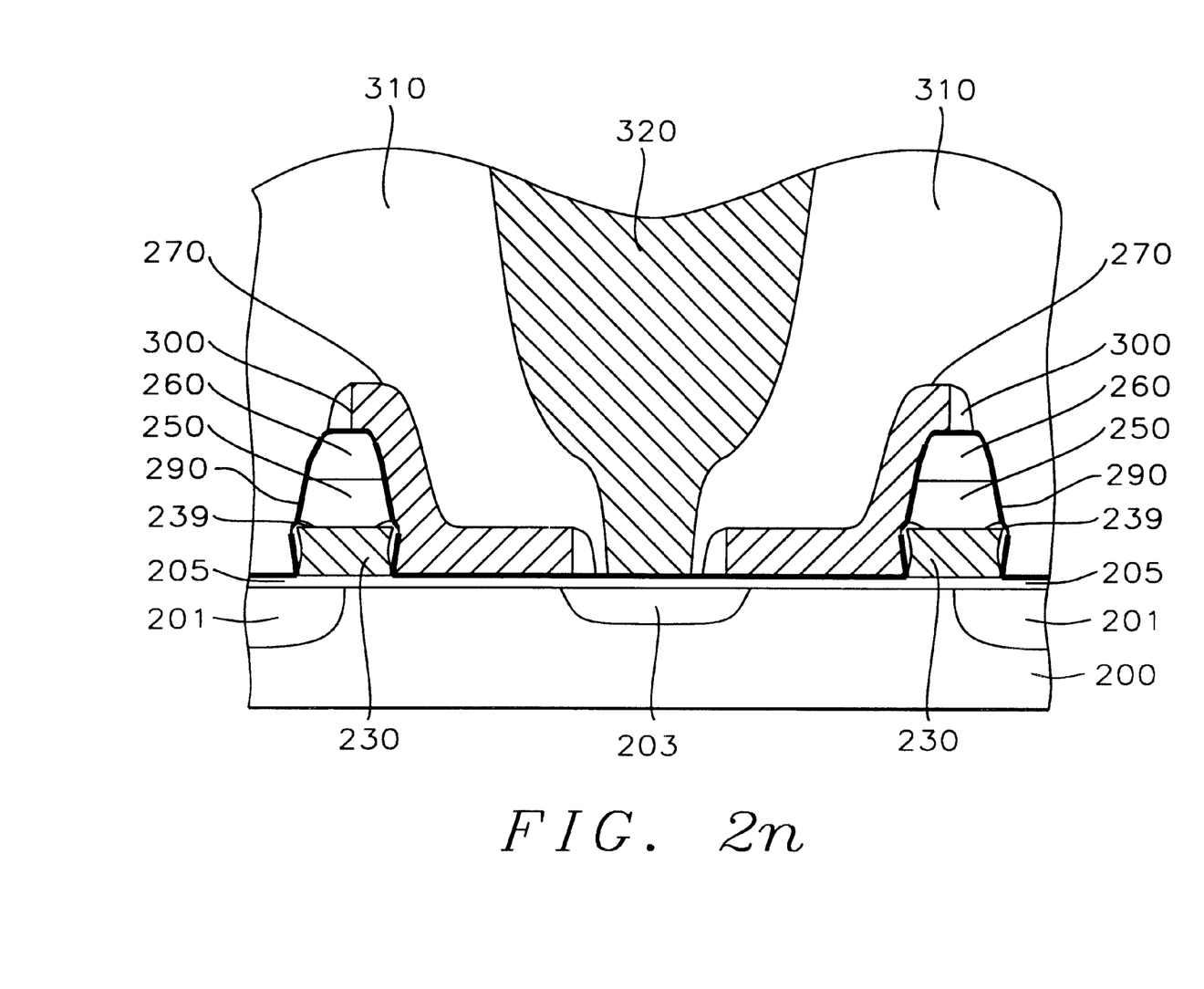
FIG. 2n shows a partial cross-sectional view of the substrate of FIG. 2m after the forming of the contact hole and the metal plug in the hole of the split-gate flash memory cell of this invention having a poly-tip as well as a self-aligned source line.

It is proposed in this invention a method of oxidizing a relatively thin polygate so as to decrease the growth of the protrusion of conventional gate bird's beak (GBB) to a smaller and sharper tip shown by reference numerals (239) in FIGS. 2a–2n of this invention. It will be known by those skilled in the art that GBB is easily damaged during conventional poly etching where polyoxide is used as a hard mask. To use polyoxide as a hard mask, thick polysilicon is needed in the first place. Such thick poly will increase gate coupling ratio, which has the attendant effect of degrading program and erasing performance of the memory cell. It is disclosed in the present invention that thick polysilicon is not needed because the oxidation is performed on the side-walls of the poly-gate to form the poly-tip. Finally, with the disclosed smaller poly-tip of this invention in comparison with the GBB of prior art, the smaller is the encroachment under the polysilicon edge, and hence the smaller is the impact on the electric-field intensity between the corner edge of the floating gate and the control gate of the completed cell structure, and thus faster is the memory speed. (See S. Wolf and R. N. Tauber, "Silicon Processing for the VLSI Era," vol. 2, Lattice Press, Sunset Beach, Calif., 1990, p. 438). It will also be appreciated that the smaller the bird's beak, the smaller is the overall size of the memory cell contributing to the increased speed of the memory.

Various methods of forming split-gate flash memory cell can be found in prior art. Hong, in U.S. Pat. No. 5,495,441 discloses a split-gate memory cell having a vertical isolation gate and a process for making it. By use of a vertical isolation, Hong is able to obtain smaller size cell, hence denser memory array. Ahn, on the other hand, discloses in U.S. Pat. No. 5,716,865, a method of making split-gate flash EEPROM cell by separating the tunneling region from the channel. The flash EEPROM cell of the invention is capable of preventing the degradation of the tunnel oxide film of the cell due to the band-to-band tunneling and the secondary hot carrier which are generated by a high electric field formed at the overlap region between the junction region and the gate electrode when programming an erasure operations are performed by a high voltage to the structure in which the tunneling region is separated from the channel with a thick insulation film. A process for trench-isolated self-aligned split-gate EEPROM transistor and memory array is disclosed by Hazani in U.S. Pat. No. 5,162,247 where the process results in a structure that allows programming and erasure by electron tunneling only.

More generally, Ashida of U.S. Pat. No. 5,262,655 shows a method of forming an SRAM having a thermal oxide spacer that round the top of the polygate, rather than sharpening it. Wang of U.S. Pat. No. 5,597,751 discloses a method of forming a memory cell structure in a semiconductor substrate that does not have a shorting problem between a floating gate and a source/drain region of the substrate by depositing a thick spacer oxide layer on top of the floating gate and the source/drain region to a sufficient thickness such that electrical insulation is provided therebetween to prevent the occurrence of a short or the formation of a silicide bridge. Gill, et al., in U.S. Pat. No. 5,173,436 use a floating gate transistor with or without a split-gate to construct EEPROM with trench-isolated bitlines.

The present invention discloses a split-gate flash memory cell having a self-aligned source and a sharp poly-tip, without the need for thick poly and no oxide thinning effect.

SUMMARY OF THE INVENTION

It is therefore an object of this invention to provide method of forming a novel split-gate flash memory cell with a thin poly-tip.

It is another object of the present invention to provide a method of forming a split-gate memory cell with a thin poly-gate, and without oxide thinning effect.

It is still another object of this invention to provide a method of forming a self-aligned source line in a split-gate flash memory cell.

It is yet another object of this invention to provide a split-gate memory cell with a novel poly-tip for enhanced F-N tunneling.

These objects are accomplished by providing a semiconductor substrate having active and passive regions defined; performing voltage threshold adjustment implantation; forming a gate oxide layer over said substrate; forming a first polysilicon layer over said gate oxide layer; forming a first nitride layer over said first polysilicon layer (poly-1); forming a shallow trench ST-photomask over said first nitride layer; forming said shallow trench in said substrate by etching said first nitride layer, first polysilicon layer, gate oxide layer and said substrate; removing said ST-photomask; depositing a first oxide layer over said substrate including said shallow trench; performing chemical mechanical polishing of said first oxide layer over said substrate; removing said first nitride layer; forming a second oxide layer over said substrate; depositing a second nitride layer over said second oxide layer; forming a poly-1 photomask over said second nitride layer; forming openings in underlying said second nitride layer, said second oxide layer and first polysilicon layer through patterns in said poly-1 photomask to form a floating gate structure; removing said poly-1 photomask; performing oxidation of said first polysilicon layer to form a novel poly-tip for said floating gate; forming a hot temperature oxide (HTO) layer over said substrate including said poly-tip and floating gate; forming a second polysilicon layer (poly-2) over said HTO layer; forming a poly-2 photomask over said second polysilicon layer; etching and patterning said second polysilicon layer through said poly-2 photomask to form a control gate; removing said poly-2 mask; forming a self-aligned source (SAS)-photomask over said substrate including said poly-2 layer; etching through said SAS-mask and removing said oxide in said shallow trench; performing ion implantation through said patterning in said second poysilicon layer to form source regions in said substrate; removing said SAS-mask; performing source drive; forming a conformal oxide layer over said substrate; forming oxide spacers; performing ion implantation to form drain regions in said substrate; forming interlevel dielectric layer over said substrate; forming contact holes in said interlevel dielectric layer; forming metal in said contact holes; and etching back excess metal over said substrate in preparation for performing the remaining process steps in the manufacture of said flash split-gate memory device.

These objects are accomplished further by providing a semiconductor substrate having active and passive regions defined; a shallow trench isolation formed in said substrate; a floating gate structure further comprising a first polysilicon layer, an oxide layer on top, which turn is covered by a silicon nitride layer formed on said substrate; a novel poly-tip formed of said floating gate structure; a hot temperature oxide (HTO) layer covering said floating gate structure, including said poly-tip; a control gate formed over said HTO layer serving as inter-gate poly; oxide spacers formed over said sidewalls of said floating gate and said control gate; a self-aligned source line formed in said substrate; source and drain regions in said substrate; and a metal plug in a contact hole contacting said source region.

DESCRIPTION OF THE PREFERRED EMBODIMENTS

Referring now to the drawings, in particular to FIGS. 2a–2n, there are shown schematically steps of forming a novel split-gate flash memory cell having a self-aligned source and a poly-tip formed by sidewall oxidation of the poly-gate as disclosed hereafter.

FIG. 2a shows a top view of a portion of a silicon substrate provided with active and passive regions as known in the art. The top view shows regions of shallow trench isolation (220), also well known in the art, to be formed, as shown in FIG. 2b, which is a cross-sectional view of substrate (200) taken at 2b–2b. For clarity, the top view also shows regions (210) where first polysilicon layer (poly-1) will be deposited to form the floating gate of the split-gate flash memory cell.

First, the split-gate flash cell voltage threshold adjust is accomplished by preferably implanting boron at a dosage level between about $3 \times 10^{12}$ to $4 \times 10^{12}$ atoms/cm$^2$ and energy level between about 45 to 55 KEV. Floating gate oxide (205) is next thermally grown at a temperature between about 850 to 900° C., to a thickness between about 70 to 90 Å. 850 to 900 ° C., to a thickness between about 70 to 90 Å. This is followed by the deposition of a first polysilicon layer, poly-1, (230) as shown in FIG. 2b. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 600 to 620° C. Also, the polysilicon is implanted with phosphorous at a dosage level between about $1 \times 10^{14}$ to $2 \times 10^{14}$ atoms/cm$^2$ at an energy level between about 20 to 30 KEV. However, it is critical that the polysilicon layer has a thickness between about 800 to 900 Å. Silicon nitride layer (240) is next formed over poly-1 layer by reacting dichlorosilane ($SiCl_2H_2$) with ammonia ($NH_3$) in an LPCVD at a pressure between about 0.2 to 0.4 torr, temperature between about 800 to 850 ° C.

At the next step, using conventional techniques, a photoresist layer is formed (not shown) to define the shallow trench isolation (STI) areas and the defined areas are then etched trough nitride, polysilicon, gate oxide layers and into silicon (200) to form the trenches (220) shown in FIG. 2b. It is preferred that the depth of the trench is between about 3400 to 3600 Å and is obtained through reactive ion etch. The forming of the STI is completed by removing the photoresist mask—by oxygen plasma ashing—filling the trenches by oxide deposition, performing chemical mechanical polishing including an oxide wet dip. It is preferred that this first oxide has a thickness between about 5000 to 7000 Å. Nitride layer (240) is then removed by conventional wet etching as shown in FIG. 2c. It will be noted that poly-1 is left only in regions (210) shown in FIGS. 2a–2c.

A cross-sectional view, 2e–2e, of substrate (200), perpendicular to the previous view 2b–2b is shown in FIG. 2e after having formed two new layers, namely, a second oxide layer (250) covering poly-1 layer (230) followed by silicon nitride layer (260). Preferably, the relatively thick second oxide layer (250) is formed by decomposing tetraethyl orthosilicate, or TEOS in a medium temperature LPCVD reactor and that it has a thickness between about 900 to 1000 Å, while the second nitride layer, (260), is relatively thin, between about 450 to 550 Å. FIG. 2e is a cross-section along one of the regions (210) where the poly-1 layer remains from a previous process step. Next, a second photoresist layer is formed and patterned to form a poly-1 mask (270) shown in FIG. 2e. Using the gate poly-1 mask, silicon nitride, oxide and first polysilicon layers, in that order, are slope etched, that is, with a slope as shown in FIG. 2f, until the floating gate oxide layer (205) is reached.

As a main feature and key aspect of the present invention, the sidewalls of the floating gate structure shown in FIG. 2f are next wet oxidized at a temperature between about 850 to 950° C. and to a thickness between about 70 to 100 Å. It is important that the oxidation rate of the polysilicon is 2 to 3 times faster than that of silicon. Poly-oxide (235) is then formed on the sidewalls of poly-gate (230) as shown in FIG. 2g, assuming an oblong shape on the sidewalls as well as on the top edge of the poly-gate, thus forming a sharp tip shown in the area referenced by (239). It will be noted that oxide layer (250) performs the function of the conventional poly-oxide that would normally be obtained by oxidizing a thicker polysilicon layer. However, with thinner poly-gate (230), a sharper poly-tip (239) is achieved with the attendant advantages for F-N tunneling. The preferred thickness of poly-tip (239) is between about 70 to 150 Å.

The tip is further ruggedized by encasing it, along with the rest of the floating gate structure, with a layer of hot temperature oxide (HTO), though the main purpose of the HTO is to prevent charge leakage from the floating gate to the control gate. It will be obvious to those practicing the art that the HTO, reference numeral (290) in FIGS. 2h –2m, also serves as interpoly oxide between the floating gate and the control gate to be formed at a later step. It is preferred that the HTO has a thickness between about 90 to 110 Å, and that it is formed by an LPCVD process in which dichlorosilane and nitrous oxide are reacted at a high temperature between about 800 to 900° C.

A second polysilicon (poly-2) layer (270) is next deposited over HTO layer (290) and patterned to form a control gate using a second photoresist layer (not shown) and a mask having control gate patterns. Layer (270) shown in FIG. 2i is preferably formed through a LPCVD method employing silane $SiH_4$ as a silicon source material at a temperature range between about 600 to 630° C. and to a thickness between about 1000 to 1500 Å. Preferably poly-2 is doped with phosphorous and that tungsten silicide of thickness between about 900 to 1000 Å is also formed over it. The etching of the second polysilicon layer to form the control gate is accomplished by using a recipe comprising gases $SF_6$/He/HBr at an ambient pressure between about 75 to 85 mTorr, and energy level between about 375 to 425 watts. After the forming of the control gate, poly-2 photomask is removed by oxygen plasma ashing.

Another phtoresist layer is formed and patterned to form a self-aligned source (SAS) mask (280) as shown in FIG. 2j. Cross-sectional views of the substrate taken at 2k–2k, and 2l–2l after the forming of the poly-1 mask and SAS mask are shown in the respective FIGS. 2k and 2l. It will be noted that the cross-section taken at 2k–2k shows the first polysilicon (poly-1) layer (230), while the one taken at 2l–2l along the trench region does not, since poly-1 was etched away from those areas when forming the trenches. Using the SAS mask (280), oxide (207) (See FIG. 2c) in trench (225) is removed. It is preferred that the following etch recipe with a high selectivity to silicon and $Si_3N_4$ is used for this purpose: gases $CF_4$/$CHF_3$/CO/Ar at a pressure between about 900 to 1000 mTorr, with an energy level between about 750 to 850 watts. Thus, the shallow trench etch is self-aligned to poly-1 as seen in FIG. 2l and the self-aligned source (SAS) line is also as shown in FIG. 2m. FIG. 2m shows the spatial relationships of the polygates and the self-aligned source lines with respect to contact holes which are to be formed later.

After the forming of control gate (270), conventional source regions (201) are formed in substrate by implanting phosphorous at a concentration between about $1\times10^{15}$ to $3\times10^{15}$ atoms/cm$^2$, and energy level between about 40 to 60 KEV. A source drive-in of about 70 to 80 Å is accomplished with dry oxygen at a temperature between about 800 to 900 ° C. and for between about 25 to 35 minutes. Source regions are shown with reference numerals (201) in FIG. n.

Nitride spacers (300) are next formed as shown in both FIGS. 2i and 2n. This is accomplished by depositing a conformal nitride layer (not shown) to a thickness between about 1000 to 1500 Å, and then performing anisotropic etching using a recipe comprising gases CF4/$CHF_3$/Ar at a pressure between about 775 to 825 mTorr and energy between about 375 to 425 watts. It will be noted that SAS etching and source implantation can also be performed after this step of etching. Then, drain regions (203) are defined using a third photoresist layer (not shown), and formed by implanting arsenic at a concentration between about $3\times10^{15}$ to $5\times10^{15}$ atoms/cm$^2$, and energy level between about 35 to 45 KEV.

After the removal of the implant photomasks, an inter-level dielectric layer (310) is formed over the substrate as shown in FIG. 2n, using conventional techniques. Blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, dielectric layer (310) is preferably formed of a dielectric material chosen from the group of dielectric materials consisting of silicon oxide dielectric materials, silicon nitride, and silicon oxynitride. Preferably, the thickness of layer (310) is between about 1 to 2 micrometers ($\mu$m). The ILD layer is next planarized and photo-etched using conventional techniques to form contact hole (320) to contact the drain region of the substrate as shown in FIG. 2n. Finally, the hole is filled with metal, preferably tungsten, and the excess removed by chemical mechanical polishing to form metal plug (320) in preparation for performing the remaining process steps in the manufacture of the split-gate flash memory device of this invention. The spatial relationship between the two polysilicon gates, contact hole and the self-aligned source line of this invention are better seen in FIG. 2m.

In operation, the relative thinness of the floating gate, (230), and the presence of a thin pointed poly-tip, (239), between the floating gate, (230), and the control gate, (270), augments performance. That is, the local electric field is enhanced with the poly-tip of polygate so that the erase speed, for example, becomes faster. Some of the operational parameters are given below:

|         | control gate | source | drain   | substrate |
|---------|--------------|--------|---------|-----------|
| program | 1.5–2.0 V    | ≦10 V  | 0–0.8 V | 0         |
| erase   | ≦11 V        | 0      | 0       | 0         |
| read    | 3–5 V        | 0      | 2–3 V   | 0         |

Thus, a method of forming a novel split-gate flash memory cell having a novel poly-tip has been disclosed. At the same time, a method of forming a self-aligned source (SAS) line is disclosed. A relatively thin polygate is formed so as to decrease the growth of the protrusion of conventional gate bird's beak (GBB) to a smaller and sharper tip. It will be known by those skilled in the art that GBB is easily damaged during conventional poly etching where polyoxide is used as a hard mask. To use polyoxide as a hard mask, thick polysilicon is needed in the first place. Such thick poly will increase gate coupling ratio, which has the attendant effect of degrading program and erasing performance of the memory cell. Furthermore, as the cell size is being scaled down, poly oxidation is getting to be a difficult process due to oxide thinning effect, unless a protective measure is undertaken as disclosed in this invention. Finally, with the disclosed smaller poly-tip of this invention in comparison with the GBB of prior art, the smaller is the encroachment under the polysilicon edge, and hence the smaller is the impact on the electric-field intensity between the corner edge of the floating gate and the control gate of the completed cell structure, and thus faster is the memory speed.

While the invention has been particularly shown and described with reference to the preferred embodiments thereof, it will be understood by those skilled in the art that various changes in form and details may be made without departing from the spirit and scope of the invention.

What is claimed is:

1. A split-gate flash memory cell comprising:

providing a semiconductor substrate having active and passive regions defined;

a shallow trench isolation formed in said substrate;

a floating gate structure further comprising a first polysilicon layer, an oxide layer on top, which in turn is covered by a silicon nitride layer formed on said substrate;

a novel poly-tip formed of said floating gate structure, said poly-tip having a thickness between about 80 to 100 Å;

a hot temperature oxide (HTO) layer covering said floating gate structure, including said poly-tip;

a control gate formed over said HTO layer serving as inter-dielectric poly;

oxide spacers formed over sidewalls of said floating gate and said control gate;

a self-aligned source line formed in said substrate; source and drain regions in said substrate; and a metal plug in a contact hole contacting said source region.

2. The split-gate flash memory of claim 1, wherein the thickness of said first polysilicon layer is between about 800 to 900 Å.

3. The split-gate flash memory of claim 1, wherein said shallow trench isolation has a depth between about 3400 to 3600 Å.

4. The split-gate flash memory of claim 1, wherein said HTO layer has a thickness between about 90 to 105 Å.

5. The split-gate flash memory of claim 1, wherein said metal plug comprises tungsten.

* * * * *